(12) United States Patent
Cho et al.

(10) Patent No.: US 6,919,761 B2
(45) Date of Patent: Jul. 19, 2005

(54) WIDEBAND VARIABLE GAIN AMPLIFIER WITH HIGH LINEARITY OPERATING IN SWITCH MODE

(75) Inventors: Young-Ho Cho, Seongnam-si (KR); Bo-Eun Kim, Yongin-si (KR); Bon-Kee Kim, Seongnam-si (KR)

(73) Assignee: Integrant Technologies Inc., Seongnam (KR)

( * ) Notice: Subject to any disclaimer, the term of this patent is extended or adjusted under 35 U.S.C. 154(b) by 41 days.

(21) Appl. No.: 10/724,119

(22) Filed: Dec. 1, 2003

(65) Prior Publication Data

US 2004/0108893 A1 Jun. 10, 2004

(30) Foreign Application Priority Data

Nov. 29, 2002 (KR) ................................ 10-2002-0075285

(51) Int. Cl.[7] .................................................. H03F 1/14
(52) U.S. Cl. ......................... 330/51; 330/282; 330/285
(58) Field of Search ............................ 330/51, 282, 285

(56) References Cited

U.S. PATENT DOCUMENTS

| | | | | |
|---|---|---|---|---|
| 4,099,134 A | * | 7/1978 | Schroder | 330/51 |
| 5,355,096 A | * | 10/1994 | Kobayashi | 330/278 |
| 5,949,286 A | | 9/1999 | Jones | |
| 6,104,246 A | * | 8/2000 | LaFerrara et al. | 330/282 |
| 6,331,804 B1 | * | 12/2001 | Shimizu et al. | 330/285 |
| 6,842,071 B1 | * | 1/2005 | Retz et al. | 330/133 |

* cited by examiner

*Primary Examiner*—Patricia Nguyen
(74) *Attorney, Agent, or Firm*—Shinjyu Global IP Counselors, LLP

(57) ABSTRACT

Disclosed is a wideband variable gain amplifier with high linearity that operates in a switch mode. The variable gain amplifier includes a first amplifier unit, a second amplifier unit and a third amplifier unit. The first amplifier unit includes an amplifier, a wideband-matching element, an attenuator and first switching means. The first amplifier unit supports a high gain mode operation and a low gain mode operation. In the high gain mode, the first switching means is short-circuited and an input signal is amplified with a high gain. It is thus possible to reduce noise characteristics of the entire system by a rear stage. In the low gain mode, the first switching means is opened and the input signal is attenuated by the attenuator without an amplification operation. It is thus possible to reduce a non-linearity occurring by the rear stage of the first amplifier unit. According to another embodiment of the present invention, only the first amplifier unit can be independently used in order to amplify a signal. Furthermore, a variable gain amplifier can be implemented by connecting various combinations of the second amplifier unit and the third amplifier unit at the rear of the first amplifier unit.

7 Claims, 4 Drawing Sheets

105

WIDEBAND VARIABLE GAIN AMPLIFIER WITH HIGH LINEARITY OPERATING IN SWITCH MODE

BACKGROUND OF THE INVENTION

1. Field of the Invention

The present invention relates to a variable gain amplifier, and more particularly, to a wideband variable gain amplifier with high linearity that operates in a switch mode.

2. Background of the Invention

A variable gain amplifier refers to a device which functions to maintain a desired output signal level by controlling its gain. The variable gain amplifier is usually used in radio frequency-receiving devices in which a signal received through an antenna has a high dynamic range. In order for a signal of a constant level to be supplied to a base band terminal of the received signal, the variable gain amplifier must also have a high dynamic range.

Many researches have been actively made so far on a variable gain amplifier, and hence various variable gain amplifiers have been proposed. Researches are in progress to increase the dynamic range of the variable gain amplifier and improve a linearity of a signal.

One example of prior arts attempted to improve a linearity of a variable gain amplifier includes U.S. Pat. No. 5,949,286.

The prior art amplifier includes a differential amplifier transistor pair for amplifying an input signal and a diode pair connected between the emitters of the transistor pair to provide its gain control using emitter degeneration.

In other words, the amount of current applied to a diode pair can be controlled by connecting a transistor circuit to the diode pair and varying a control voltage applied to the transistor. Therefore, an impedance value of the diode pair is controlled by the control voltage, so that a gain control of the variable gain amplifier can be accomplished.

The variable gain amplifier disclosed in U.S. Pat. No. 5,949,286, however, has the diodes connected to its input terminal for performing a predistortion function, thereby improving non-linear characteristics of the diode pair connected between the emitters of the transistor pair. Furthermore, a dummy amplifier is connected to the differential amplifier transistor pair to cancel the capacitive effects generated by the diode pair in order to increase the gain control range of the amplifier at higher frequencies.

For the variable gain amplifier disclosed in U.S. Pat. No. 5,949,286, however, since it employs the dummy amplifier to improve its linearity, there has been a problem in that additional current and chip area are needed, and in that there is a limit in improving linear-characteristics using an active element.

SUMMARY OF THE INVENTION

Accordingly, the present invention has been made to substantially obviate one or more problems due to limitations and disadvantages of the related art.

An object of the present invention is to provide a variable gain amplifier having an excellent linearity.

Another object of the present invention is to provide a variable gain amplifier that can perform an optimum operation in a high gain mode or a low gain mode.

Still another object of the present invention is to provide a variable gain amplifier having an excellent amplification operation at a wideband.

To achieve the above objects, according to one embodiment of the present invention, there is provided a variable gain amplifier having an input terminal and an output terminal, for amplifying a signal inputted to the input terminal to output the amplified signal, the amplifier operating in a high gain mode or a low gain mode, comprising: an amplifier element having a first terminal constituting the input terminal of the variable gain amplifier, a second terminal constituting the output terminal of the variable gain amplifier and a third terminal connected to a second power supply, wherein the amount and direction of current of the amplifier element, which flows from the second terminal to the third terminal, are varied based on the amount of a voltage applied to the first terminal; a wideband-matching element connected between the input terminal and the output terminal of the variable gain amplifier, for matching input impedance at a wideband upon the operation of the variable gain amplifier in the high gain mode; an attenuator connected between the input terminal and the output terminal of the variable gain amplifier, for attenuating the input signal to output the attenuated signal to the output terminal upon the operation of the variable gain amplifier in the low gain mode; means connected to the first terminal of the amplifier element, for activating the amplifier element upon the operation of the variable gain amplifier in the high gain mode; and a load resistor connected between the first terminal of the amplifier element and a first power supply.

Preferably, the wideband-matching element includes a capacitor, an inductor, a resistor and switching means, wherein one end of the capacitor is connected to the input terminal of the variable gain amplifier, the other end of the capacitor is serially connected to the inductor, the resistor and the switching means, and the other end of the switching means is connected to the output terminal of the variable gain amplifier.

Preferably, the attenuator includes a capacitor, a resistor and switching means, wherein one end of the capacitor is connected to the input terminal of the variable gain amplifier, the other end of the capacitor is serially connected to the resistor and the switching means, and the other end of the switching means is connected to the output terminal of the variable gain amplifier.

Also, the means for activating the amplifier element in the high gain mode preferably includes switching means and a bias voltage.

It is preferred that the amplifier element is a MOSFET transistor, the first terminal of the amplifier element is a gate, the second terminal thereof is a drain, and the third terminal thereof is a source.

It is also preferred that the variable gain amplifier further comprises a second amplifier circuit, including: first and second amplifier elements each having a first terminal, a second terminal and a third terminal, wherein the amount and direction of current of each of the first and second amplifier elements, which flows from the second terminal to the third terminal, are varied based on the amount of a voltage applied to the first terminal; first and second load resistors each connected between the second terminal of each of the first and second amplifier elements and a first power supply; first and second current sources connected to the third terminals of the first and second amplifier elements, respectively; a source degeneration variable resistor connected between the third terminals of the first and second amplifier elements; and a load degeneration variable resistor connected between the second terminals of the first and second amplifier elements, wherein the first terminal of the first amplifier element is connected to the output terminal of the variable gain amplifier, the first terminal of the second amplifier element is grounded, and the second terminals of the first and second amplifier elements form second negative (−) and positive(+) output terminals, respectively.

It is preferred that the variable gain amplifier further comprises a third amplifier circuit, including: first and second amplifier elements each having a first terminal, a second terminal and a third terminal, wherein the amount and direction of current of each of the first and second amplifier elements, which flows from the second terminal to the third terminal, are varied based on the amount of a voltage applied to the first terminal; first and second load resistors each connected between the second terminal of each of the first and second amplifier elements and a first power supply; first and second current sources connected to the third terminals of the first and second amplifier elements, respectively; and a source degeneration variable resistor connected between the third terminals of the first and second amplifier elements, wherein the first terminals of the first and second amplifier elements are connected to the second negative(−) and positive(+) output terminals, respectively, and the second terminals of the first and second amplifier elements form third negative(−) and positive(+) output terminals, respectively.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

A variable gain amplifier according to the present invention employs a MOSFET transistor amplifier. The amplifier has a gate, a source and a drain. The MOSFET transistor has a property that the amount and direction of current flowing from its source to its drain, and vice versa are decided depending on the amount and polarity of a voltage applied to its gate. Such an amplifier may involve a bipolar junction transistor (BJT), a junction field effect transistor (JFET), a metal oxide semiconductor field effect transistor (MOSFET), a metal semiconductor field effect transistor (MESFET), and so on.

Furthermore, most of these amplifiers utilize two complementary devices that are complementary each other, i.e., a first complementary device, for example, an N type MOSFET, and a second complementary device, for example, a P type MOSFET. The first complementary device and the second complementary device have a property that the amount and direction of current flowing from their sources Ns and Ps to its drains Nd and Pd, and vice versa are decided depending on the amount and polarity of a voltage applied to its gates Ng and Pg.

It is said that the MOSFET Of the mentioned amplifiers has the least difference in characteristics between complementary devices of the same specification. It is thus preferred that the MOSFET is used. In view of the above, description on MOSFET only will be given in the present context. It is, however, to be noted that the spirit of the present invention can be applied to all devices that operate complementarily as well as MOSFETs. Furthermore, those skilled in the art will appreciate that the concept of the present invention can be applied to a P type MOSFET although an N type MOSFET is described in the present specification.

Figure 1:
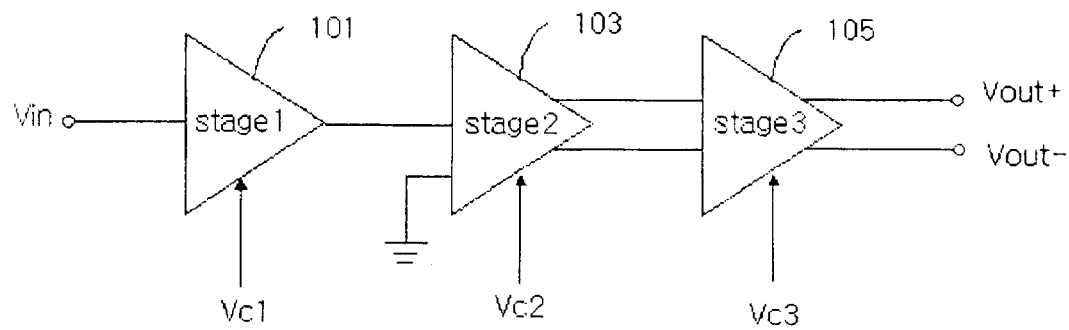
FIG. 1 is a block diagram schematically showing the configuration of a variable gain amplifier according to one embodiment of the present invention.

FIG. 1 is a block diagram schematically showing the configuration of the variable gain amplifier according to one embodiment of the present invention.

As shown in FIG. 1, the variable gain amplifier according to one embodiment of the present invention includes first, second and third amplifier units 101, 103 and 105. First, second and third control signals Vc1, Vc2 and Vc3 are applied to the first, second and third amplifier units 101, 103 and 105, respectively. A gain of each amplifier unit is controlled by each control signal.

In the variable gain amplifier according to one embodiment of the present invention, the first amplifier unit 101 is constructed to operate in a high gain mode or a low gain mode depending on the first control signal Vc1 applied thereto. In other words, if an amplification operation of a high gain is needed since a voltage level of a received signal is low, the first amplifier unit 101 supports a high gain mode operation. Meanwhile, if the linearity of a signal is critical since a voltage level of a received signal is high, the first amplifier unit 101 supports a low gain mode operation. The high gain mode and the low gain mode are determined by the first control signal Vc1 applied thereto.

The second amplifier unit 103 consists of a differential amplifier circuit, and functions to amplify a voltage difference between an output voltage of the first amplifier unit 101 and a ground voltage with a given gain. A gain of the second amplifier unit 103 is determined by the second control signal Vc2.

The third amplifier unit 105 consists of a differential amplifier circuit, and functions to amplify a voltage difference between output voltages of the second amplifier unit 103 with a given gain. A gain of the third amplifier unit 105 is determined by the third control signal Vc3.

Figure 2:
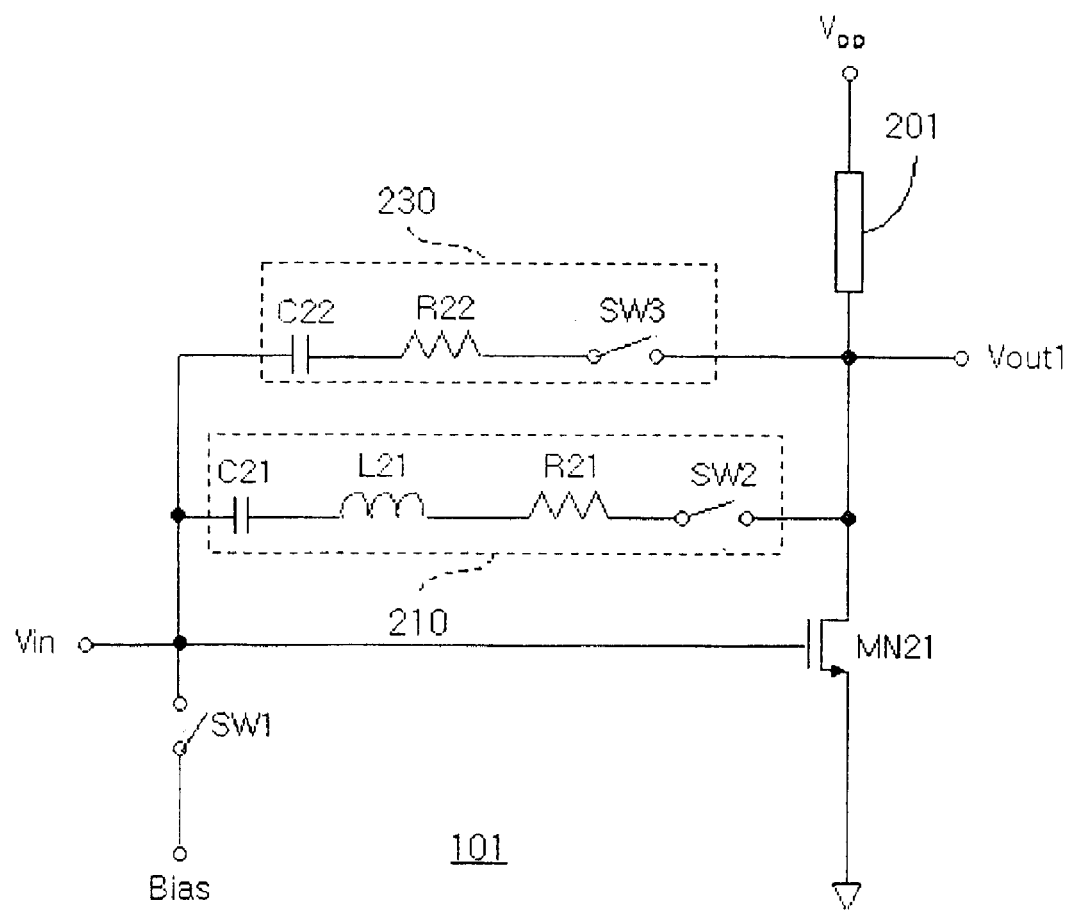
FIG. 2 is a circuit diagram showing a detailed configuration of the first amplifier unit of the variable gain amplifier shown in FIG. 1 according to one embodiment of the present invention.

FIG. 2 is a circuit diagram showing a detailed configuration of the first amplifier unit 101 of the variable gain amplifier shown in FIG. 1.

As shown in FIG. 2, the first amplifier unit 101 according to one embodiment of the present invention includes an NMOS transistor MN21, a load resistor 201, first switching means SW1, a wideband-matching element 210, and an attenuator 230.

Interconnection relationship of the constitutional elements in the first amplifier unit 101 will now be described in detail.

A gate of the NMOS transistor MN21 forms an input terminal Vin of the first amplifier unit 101. A drain of the NMOS transistor MN21 is connected to one end of the wideband-matching element 210 and the attenuator 230 and one end of the load resistor 201, thus constituting an output terminal Vout1 of the first amplifier unit 101. A source of the NMOS transistor MN21 is grounded.

One end of the first switching means SW1 is connected to the gate of the NMOS transistor MN21. The other end of the first switching means SW1 is applied with a bias voltage Bias. The other end of the load resistor 201 is connected to a power supply $V_{DD}$.

The wideband-matching element 210 is connected between the input terminal Vin and the output terminal Vout1 of the first amplifier unit 101. The wideband-matching element 210 has a first capacitor C21, a first inductor L21, a first resistor R21, and second switching means SW2. In more detail, one end of the first capacitor C21 is connected to the input terminal Vin of the first amplifier unit 101. The other end of the first capacitor C21 is serially connected to the first inductor L21, the first resistor R21 and the second switching means SW2. The other end of the second switching means SW2 is connected to the output terminal Vout1 of the first amplifier unit 101.

The attenuator 230 is connected between the input terminal Vin and the output terminal Vout1 of the first amplifier unit 101, and includes a second capacitor C22, a second resistor R22 and third switching means SW3. In the concrete, one end of the second capacitor C22 is connected to the input terminal Vin of the first amplifier unit 101, and the other end of the second capacitor C22 is connected to one end of the second resistor R22. The other end of the second resistor R22 is connected to one end of the third switching means SW3. The other end of the third switching means SW3 is connected to the output terminal Vout1 of the first amplifier unit 101.

The operation of the first amplifier unit 101 according to one embodiment of the present invention will be described with reference to FIG. 2.

The first amplifier unit 101 according to one embodiment of the present invention supports a high gain mode operation and a low gain mode operation. In other words, if a voltage level of the input signal Vin applied to the first amplifier unit 101 is less than a predetermined reference voltage, the first amplifier unit 101 supports the high gain mode operation. Meanwhile, if a voltage level of the input signal Vin applied thereto is more than a predetermined reference voltage, the first amplifier unit 101 supports the low gain mode operation.

In the case of the high gain mode, the first and second switching means SW1 and SW2 are short-circuited and the third switching means SW3 is opened. Therefore, the gate of the NMOS transistor MN21 is applied with the bias voltage Bias and the NMOS transistor MN21 is activated accordingly. Further, the wideband-matching element 210 becomes active and the attenuator 230 becomes inactive.

The NMOS transistor MN21 functions to amplify the input signal Vin by allowing a current proportional to the voltage Vin applied to its gate to flow into its drain.

The first capacitor C21 of the wideband-matching element 210 cuts off the DC power supply $V_{DD}$ applied to the wideband-matching element 210. The first capacitor C21 also adequately selects an impedance value of the first capacitor C21, the first inductor L21 and the first resistor R21, so that the variable gain amplifier according to one embodiment of the present invention can be matched at a wideband and can obtain a flat gain at a high frequency. In other words, in general, since a MOSFET transistor has high input impedance, an impedance transformation process for impedance matching is required. As shown in FIG. 2, if the resistor, the inductor and the capacitor are serially connected in a feedback manner, it is possible to lower impedance of the MOSFET transistor and impedance matching is possible at a wideband.

In the case of the low gain mode, the first and second switching means SW1 and SW2 are opened and the third switching means SW3 is short-circuited. Therefore, the NMOS transistor MN21 and the wideband-matching element 210 become inactive and only the attenuator 230 operates.

In other words, as the input signal Vin is applied to the second capacitor C22, with a DC signal cut off, only an analog signal is outputted to the output terminal Vout via the second resistor R22 and the third switching means SW3. Accordingly, the input signal Vin does not pass through the NMOS transistor MN21 being an active element and is attenuated by the second resistor R22 being a passive device and the third switching means SW3 that is dominant in a resistor component. The attenuated signal is then transmitted to the output terminal Vout. As such, the signal has an excellent linearity.

Meanwhile, as both the second resistor R22 and the third switching means SW3 are dominant in a resistor component in a low gain mode, impedance variation depending on a frequency is very small. Therefore, wideband matching is possible by properly adjusting impedance of the second resistor R22 and the third switching means SW3.

As described above, the first amplifier unit 101 according to one embodiment of the present invention reduces a noise figure of the entire system by a rear stage, by amplifying a signal with a high gain when a voltage level of the input signal Vin is low. On the contrary, if a voltage level of the input signal Vin is high, the first amplifier unit 101 reduces a nonlinear characteristic of the entire system by a rear stage of the first amplifier unit 101, by reducing a gain of the first amplifier unit 101. It is therefore possible to improve the linearity of the variable gain amplifier.

Figure 3:
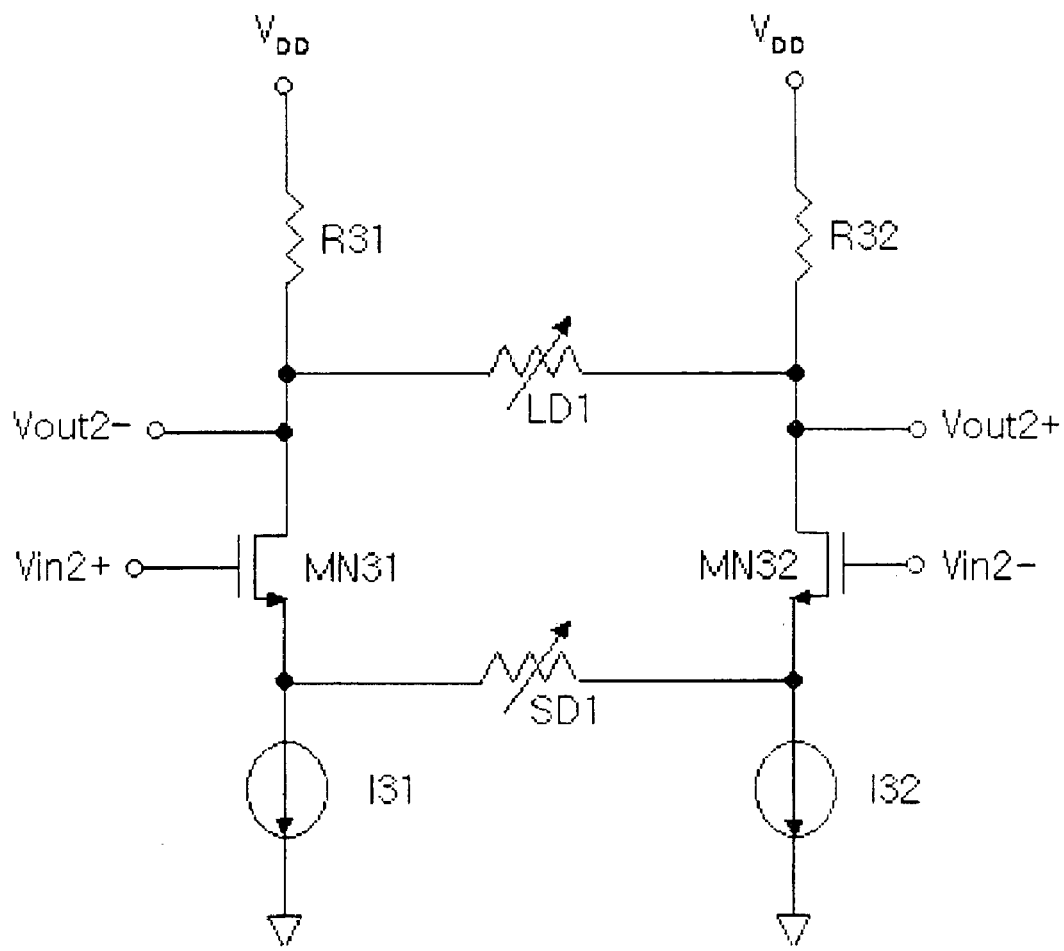
FIG. 3 is a circuit diagram showing a detailed configuration of the second amplifier unit of the variable gain amplifier shown in FIG. 1 according to one embodiment of the present invention.

FIG. 3 is a circuit diagram showing a detailed configuration of the second amplifier unit 103 of the variable gain amplifier shown in FIG. 1.

As shown in FIG. 3, the second amplifier unit 103 according to one embodiment of the present invention includes first and second NMOS transistors MN31 and MN32, first and second resistors R31 and R32, first and second current sources I31, I32, a source degeneration variable resistor SD1 and a load degeneration variable resistor LD1.

Gates of the first and second NMOS transistors MN31 and MN32 constitute + and − input terminals Vin2+ and Vin2− of the second amplifier unit 103, respectively. Drains of the first and second NMOS transistors MN31 and MN32 are connected to one ends of the first and second resistor R31 and R32, respectively, to form negative(−) and positive(+) output terminals Vout2− and Vout2+ of the second amplifier unit 103. A bias current is applied to respective sources of the first and second NMOS transistors MN31 and MN32 by means of the first and second current source I31 and I32, respectively.

The load degeneration variable resistor LD1 is connected between the drains of the first and second NMOS transistors MN31 and MN32. The source degeneration variable resistor SD1 is connected between the sources of the first and second NMOS transistors MN31 and MN32. Furthermore, the other ends of the first and second resistors R31 and R32 are connected to the power supply $V_{DD}$, respectively.

The operation of the second amplifier unit 103 will now be described.

The first and second NMOS transistors MN31 and MN32 of the second amplifier unit 103 each control the amount of current flowing from its drains to its sources by the voltages Vin2+ and Vin2− applied to its gates. Voltage drop by the first and second resistors R31 and R32 continues to vary depending on the amount of the controlled current. Thereby, a difference between voltages applied to both the + and − input terminals Vin+ and Vin− is amplified, which is thus represented at both the negative(−) and positive(+) output terminals Vout− and Vout+.

The source degeneration variable resistor SD1 and the load degeneration variable resistor LD1 control the gain and linearity of the second amplifier unit 403 by varying its resistor values. In other words, the more the resistor value of the source degeneration variable resistor SD1 is high, the more the gain of the second amplifier unit 103 is low and the more the linearity is good. Furthermore, as the load degeneration resistor LD1 can be considered as a resistor connected in parallel to the first and second resistors R31 and R32, a load resistor value of the second amplifier unit 103 can be varied by controlling the resistor value of the load degeneration resistor LD1. In more detail, the more the resistor value of the load degeneration resistor LD1 is low, the more a total value of the load resistor is low and the more the gain of the second amplifier unit 103 is low. On the contrary, if the resistor value of the load degeneration resistor LD1 is increased, influence by the load degeneration resistor LD1 is reduced and the gain of the second amplifier unit 103 is rarely affected.

It is therefore possible to control the gain and linearity of the second amplifier unit 103, by controlling the second control signal Vc2 applied to the source degeneration variable resistor SD1 and the load degeneration variable resistor LD1 according to the amount of the input signal.

Figure 4:
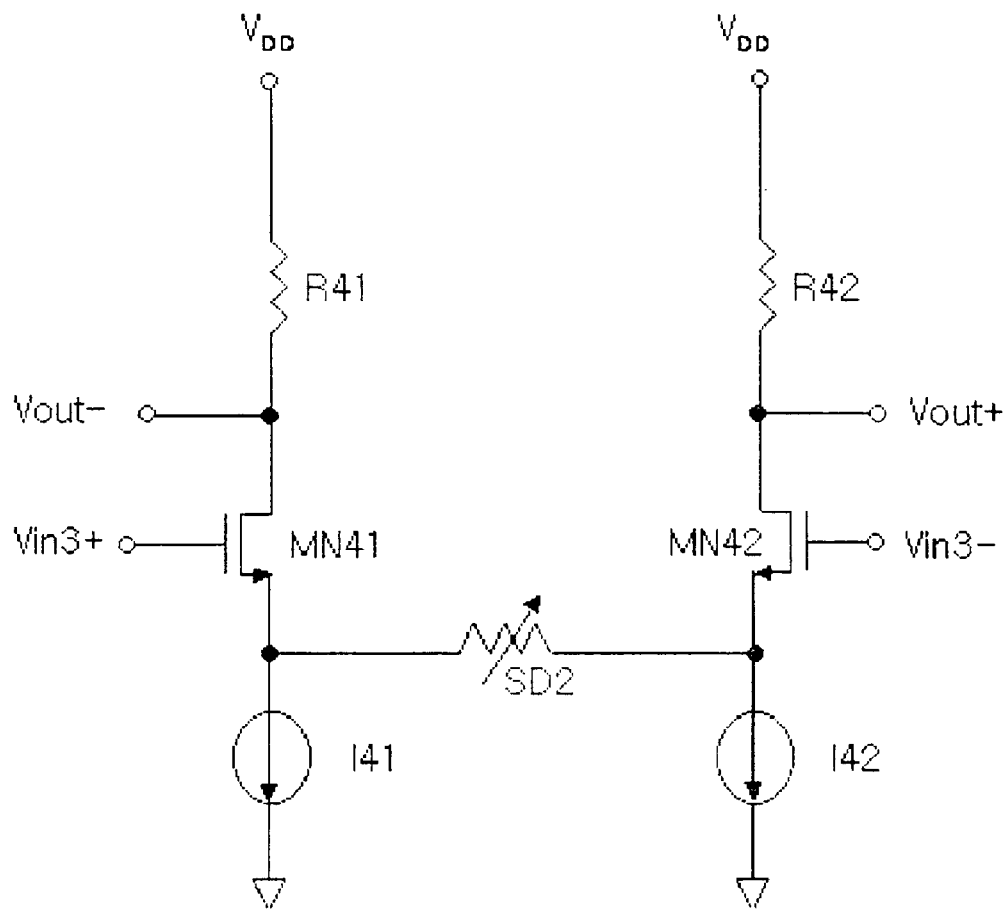
FIG. 4 is a circuit diagram showing a detailed configuration of the third amplifier unit of the variable gain amplifier shown in FIG. 1 according to one embodiment of the present invention.

FIG. 4 is a circuit diagram showing a detailed configuration of the third amplifier unit 105 of the variable gain amplifier shown in FIG. 1.

As shown in FIG. 4, the third amplifier unit 105 according to one embodiment of the present invention includes first and second NMOS transistors MN41 and MN42, first and second resistors R41 and R42, first and second current sources I41 and I42, and a source degeneration variable resistor SD2.

Gates of the first and second NMOS transistors MN41 and MN42 constitute + and − input terminals Vin3+ and Vin3− of the third amplifier unit 105, respectively. Drains of the first and second NMOS transistors MN41 and MN42 are connected to one ends of the first and second resistor R41 and R42, respectively, to form negative(−) and positive(+) output terminals Vout− and Vout+ of the third amplifier unit 105. A bias current is applied to sources of the first and second NMOS transistors MN41 and MN42 by means of the first and second current sources I41 and I42, respectively.

The source degeneration variable resistor SD2 is connected between the sources of the first and second NMOS transistors MN41 and MN42. Furthermore, the other ends of the first and second resistors R41 and R42 are connected to a power Supply $V_{DD}$.

The third amplifier unit 105 functions to amplify, once more, the output signal amplified in the second amplifier unit 103, thereby expanding a gain control range of the variable gain amplifier. The gain and linearity of the third amplifier unit 105 are controlled by a third control signal Vc3.

The amplifier circuit shown in FIG. 4, which constitutes the third amplifier unit 105, is well known in the art and the source degeneration resistor SD2 has been described with reference to FIG. 2. Therefore, description on them will be omitted for simplicity.

As described above, the amplifier circuit according to one embodiment of the present invention includes the first to third amplifier units 101 to 105, and amplifies the signal of each amplifier unit with a given gain, thus expanding its operating range.

Furthermore, the first amplifier unit 101 can improve the noise figure and linearity of the amplifier by supporting a high gain mode operation and a low gain mode operation. In other words, if a low signal is applied, the first amplifier unit 101 reduces the noise figure of the entire system by a rear stage by increasing a gain of the signal. Meanwhile, if a high signal is applied, it attenuates an input signal regardless of an amplification operation and then applies the attenuated signal to the second amplifier unit 103. Therefore, the first amplifier unit 101 can reduce the non-linearity of the entire system affected by rear stages. Furthermore, if a signal is low, it allows a variable gain amplifier according to the present invention to perform a wideband amplification operation by connecting a wideband-matching element in a feedback manner.

The second amplifier unit 103 can amplify the gain of the signal outputted from the first amplifier unit 101 by controlling the resistor value of the source degeneration variable resistor SD1 and the load degeneration variable resistor LD1. Further, it can improve the linearity of the entire system by controlling the gain and linearity of the signal depending on a level of a received signal.

The third amplifier unit 105 can expand a gain control range of the variable gain amplifier by amplifying, once more, a signal outputted from the second amplifier unit 103. It can also control the gain and linearity of the output signal by controlling a resistor value of the source degeneration variable resistor SD1, thereby improving the linearity of a variable gain amplifier.

Although it has been described, in the above description, that the variable gain amplifier includes the first to third amplifier units 101 to 105, it is only one of preferred embodiments of the present invention. Therefore, those skilled in the art will appreciate that the variable gain amplifier may include only one amplifier unit or two amplifier units depending on a specific embodiment.

That is, the variable gain amplifier may be constructed to perform two gain mode operations by using only the first amplifier unit 101. The first amplifier unit 101 and the second amplifier unit 103, or the first amplifier unit 101 and the third amplifier unit 105 may be connected to implement a variable gain amplifier. Furthermore, only a plurality of amplifications stages being a kind of the second amplifier unit 103 can be connected to implement a variable gain amplifier and only a plurality of amplifications stages being a kind of the third amplifier unit 105 can be connected to implement a variable gain amplifier, at the rear stage of the first amplifier unit 101. In other words, all kinds of combinations of the second amplifier unit 103 and the third amplifier unit 105 can be connected at the rear of the first amplifier unit 101. As the number of the amplification stage is increased, the gain control range of the variable gain amplifier is increased.

Figure 5:
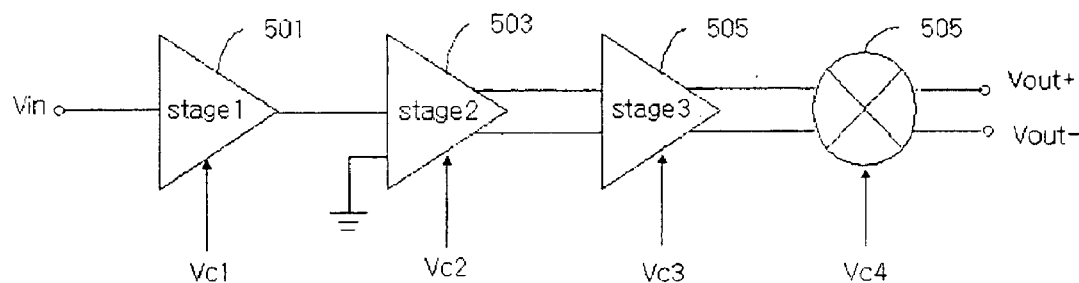
FIG. 5 is a block diagram showing the configuration of a variable gain amplifier and a switching mixer according to another embodiment of the present invention.

FIG. 5 is a block diagram showing the configuration of a variable gain amplifier and a switching mixer according to another embodiment of the present invention.

As shown in FIG. 5, depending on a case, a switching mixer 507 may be connected to the output terminal of the variable gain amplifier according to one embodiment of the present invention. The variable gain amplifier includes first, second and third amplifier units 501, 503 and 505. A gain of the switching mixer 507 is controlled by a fourth control signal Vc4 applied thereto.

Figure 6:
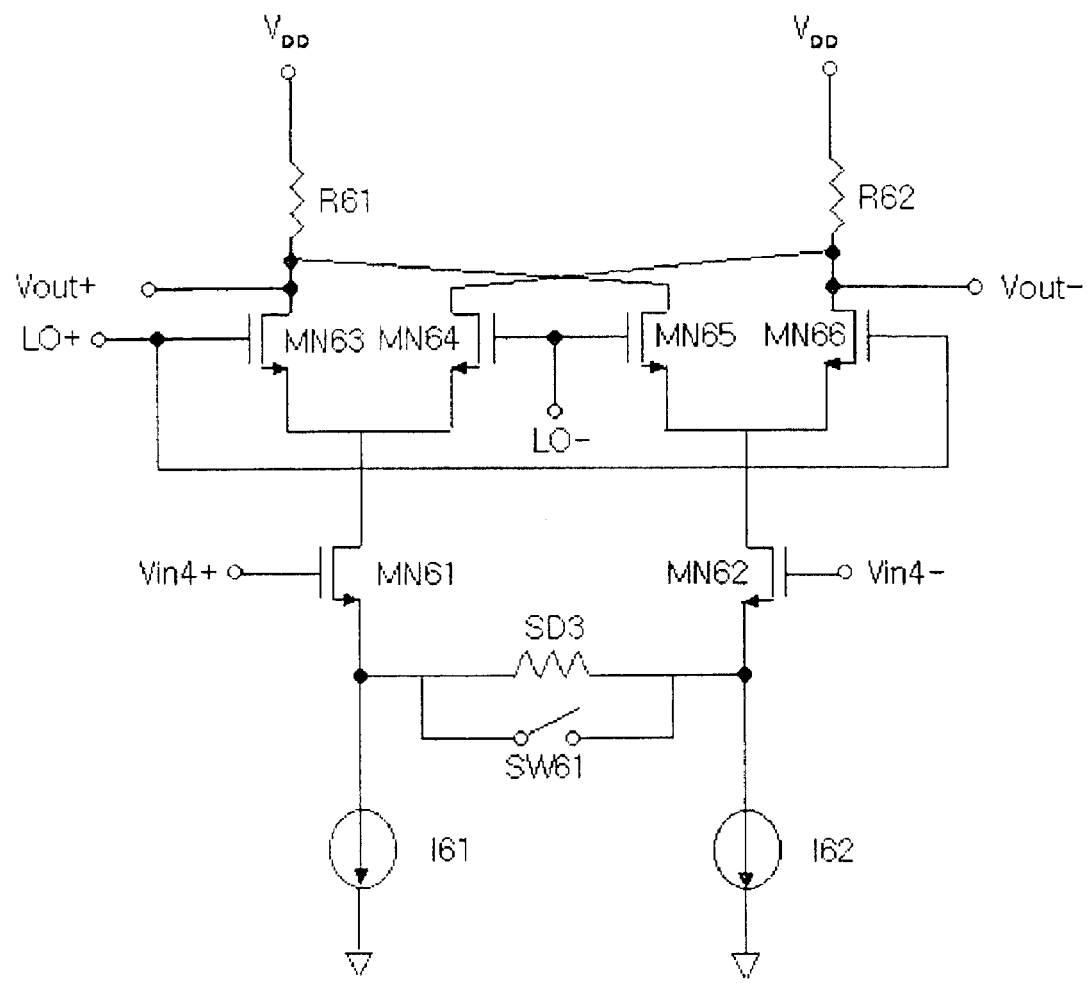
FIG. 6 is a circuit diagram showing an internal configuration of a mixer circuit shown in FIG. 5.

FIG. 6 is a circuit diagram showing an internal configuration of the mixer circuit 507 shown in FIG. 5.

The mixer circuit 507 shown in FIG. 6 represents the concept of the present invention applied to a typical Gilbert mixer circuit. A source degeneration resistor SD3 and switch means SW61 are connected between sources of first and second NMOS transistors MN61 and MN62.

In other words, the gain of the mixer circuit 507 can be controlled depending on a voltage level of inputted signals Vin4+ and Vin4−, by adding the source degeneration resistor SD3 and the switching means SW61. In more detail, if the voltage levels of the input signals Vin4+ and Vin4− are high, the switching means SW61 is opened, thereby improving the linearity of the mixer by means of the source degeneration resistor SD3. Meanwhile, if the voltage levels of the input signals Vin4+ and Vin4− are low, the switch means SW61 is short-circuited, thereby improving a gain characteristic of the mixed 507.

In another embodiments shown in FIG. 5 and FIG. 6, the gain of the inputted signal is amplified through the first to third amplifier units 501 to 505 in the variable gain amplifier. The gain of the signal outputted from the variable gain amplifier is then controlled once more in the mixer 507. It is therefore possible to improve the linearity and gain characteristics of a receiving apparatus.

INDUSTRIAL APPLICABILITY

According to the present invention described above, the gain and linearity of each amplifier unit included in a variable gain amplifier is controlled according to a voltage level of an input signal. Therefore, the present invention has an effect that it can improve the linearity of a variable gain amplifier.

Also, a high gain mode operation and a low gain mode operation are supported. In the high gain mode, an inputted signal is amplified with a high gain, thereby improving a noise figure of the entire system. In the low gain mode, an inputted signal is attenuated without an amplification operation, thereby improving the linearity of the entire system.

Furthermore, a wideband-matching element to which a capacitor, an inductor and a resistor are serially connected is connected to a first amplifier unit in a feedback manner. It thus allows a variable gain amplifier to perform an amplification operation at a wideband.

In addition, four amplifier units whose gain can be controlled are included. It is therefore possible to expand a gain control range of a variable gain amplifier.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A variable gain amplifier having an input terminal and an output terminal, for amplifying a signal inputted to the input terminal to output the amplified signal, operating in a high gain mode or a low gain mode, comprising:

an amplifier element having a first terminal constituting the input terminal of the variable gain amplifier, a second terminal constituting the output terminal of the variable gain amplifier and a third terminal connected to a second power supply, wherein the amount and direction of current of the amplifier element, which flows from the second terminal to the third terminal, are varied based on the amount of a voltage applied to the first terminal;

a wideband-matching element connected between the input terminal and the output terminal of the variable gain amplifier, for matching input impedance at a wideband upon the operation of the variable gain amplifier in the high gain mode;

an attenuator connected between the input terminal and the output terminal of the variable gain amplifier, for attenuating the input signal to output the attenuated signal to the output terminal upon the operation of the variable gain amplifier in the low gain mode;

means connected to the first terminal of the amplifier element, for activating the amplifier element upon the operation of the variable gain amplifier in the high gain mode; and a load resistor connected between the second terminal of the amplifier element and a first power supply.

2. The variable gain amplifier as claimed in claim 1, wherein the wideband-matching element includes a capacitor, an inductor, a resistor and switching means, wherein one end of the capacitor is connected to the input terminal of the variable gain amplifier, the other end of the capacitor is serially connected to the inductor, the resistor and the switching means, and the other end of the switching means is connected to the output terminal of the variable gain amplifier.

3. The variable gain amplifier as claimed in claim 1, wherein the attenuator includes a capacitor, a resistor and switching means, wherein one end of the capacitor is connected to the input terminal of the variable gain amplifier, the other end of the capacitor is serially connected to the resistor and the switching means, and the other end of the switching means is connected to the output terminal of the variable gain amplifier.

4. The variable gain amplifier as claimed in claim 1, wherein the means for activating the amplifier element in the high gain mode includes switching means and a bias voltage.

5. The variable gain amplifier as claimed in claim 1, wherein the amplifier element is a MOSFET transistor, the first terminal of the amplifier element is a gate, the second terminal thereof is a drain, and the third terminal thereof is a source.

6. The variable gain amplifier as claimed in claim 1, further comprising a second amplifier circuit, including:

first and second amplifier elements each having a first terminal, a second terminal and a third terminal, wherein the amount and direction of current of each of the first and second amplifier elements, which flows from the second terminal to the third terminal, are varied based on the amount of a voltage applied to the first terminal;

first and second load resistors each connected between the second terminal of each of the first and second amplifier elements and a first power supply;

first and second current sources connected to the third terminals of the first and second amplifier elements, respectively;

a source degeneration variable resistor connected between the third terminals of the first and second amplifier elements; and a load degeneration variable resistor connected between the second terminals of the first and second amplifier elements, wherein the first terminal of the first amplifier element is connected to the output terminal of the variable gain amplifier, the first terminal of the second amplifier element is grounded, and the second terminals of the first and second amplifier elements form second negative(−) and positive(+)output terminals, respectively.

7. The variable gain amplifier as claimed in claim 1 or 6, further comprising a third amplifier circuit, including:

first and second amplifier elements each having a first terminal, a second terminal and a third terminal, wherein the amount and direction of current of each of the first and second amplifier elements, which flows from the second terminal to the third terminal, are varied based on the amount of a voltage applied to the first terminal;

first and second load resistors each connected between the second terminal of each of the first and second amplifier elements and a first power supply;

first and second current sources connected to the third terminals of the first and second-amplifier elements, respectively; and a source degeneration variable resistor connected between the third terminals of the first and second amplifier elements, wherein the first terminals of the first and second amplifier elements are connected to the second negative(−) and positive(+) second output terminals, respectively, and the second terminals of the first and second amplifier elements form third negative(−) and positive(+) output terminals, respectively.

* * * * *